(12) United States Patent
Saffre et al.

(10) Patent No.: US 9,679,339 B2
(45) Date of Patent: Jun. 13, 2017

(54) SCHEDULING USAGE OR PROVISION OF RESOURCES

(75) Inventors: Fabrice T P Saffre, Ipswich (GB); Jessika Trancik, Santa Fe, NM (US)

(73) Assignee: BRITISH TELECOMMUNICATIONS PUBLIC LIMITED COMPANY, London (GB)

( * ) Notice: Subject to any disclaimer, the term of this patent is extended or adjusted under 35 U.S.C. 154(b) by 1336 days.

(21) Appl. No.: 12/935,801

(22) PCT Filed: Mar. 31, 2009

(86) PCT No.: PCT/GB2009/000868
§ 371 (c)(1),
(2), (4) Date: Sep. 30, 2010

(87) PCT Pub. No.: WO2009/122173
PCT Pub. Date: Oct. 8, 2009

(65) Prior Publication Data
US 2011/0029348 A1 Feb. 3, 2011

(30) Foreign Application Priority Data
Mar. 31, 2008 (EP) .................................... 08251232

(51) Int. Cl.
*G06Q 50/06* (2012.01)
*G01D 4/00* (2006.01)
(Continued)

(52) U.S. Cl.
CPC ............... *G06Q 50/06* (2013.01); *G01D 4/00* (2013.01); *G01R 22/063* (2013.01);
(Continued)

(58) Field of Classification Search
CPC ......... G06Q 50/06; Y04S 20/30; Y04S 20/32; Y04S 20/42; G01D 4/00; H02J 3/14; H04Q 2209/60
(Continued)

(56) References Cited

U.S. PATENT DOCUMENTS 4,819,180 A * 4/1989 Hedman et al. ............... 700/291
4,855,922 A * 8/1989 Huddleston et al. ......... 700/295
(Continued)

FOREIGN PATENT DOCUMENTS

WO   WO 00/17984    3/2000
WO   WO 02/084558   10/2002

OTHER PUBLICATIONS

Written Opinion of the International Searching Authority for PCT/GB 2009/000868, dated Jun. 5, 2009.
(Continued)

*Primary Examiner* — Kevin Flynn
*Assistant Examiner* — Brian Tallman
(74) *Attorney, Agent, or Firm* — Nixon & Vanderhye PC

(57) ABSTRACT

Methods and systems for obtaining a value indicative of resource-related activity in respect of a plurality of devices using a network of metering means arranged to be in communication with one another, the metering means being associated with resource-consuming or resource-providing devices and being arranged to obtain local resource-related activity data therefrom, the method comprising: a first metering means initiating a circulation procedure by sending a token to a downstream metering means, the token comprising an activity field for carrying a value indicative of resource-related activity data; the circulation procedure continuing, until the token has returned to the first metering means, by each downstream metering means in turn receiving the token, updating the activity field in dependence on its (Continued)

Overall DDSM architecture own locally-obtained resource-related activity data, and forwarding the token to a further downstream metering means; and once the token has returned to the first metering means, obtaining a value indicative of the combined level of resource-related activity in respect of devices associated with the metering means in said network in dependence on the value carried by the activity field.

12 Claims, 4 Drawing Sheets

(51) Int. Cl.
| | |
|---|---|
| G01R 22/06 | (2006.01) |
| G06Q 10/08 | (2012.01) |
| G06Q 30/02 | (2012.01) |
| G06Q 30/06 | (2012.01) |
| H02J 3/00 | (2006.01) |

(52) U.S. Cl.
CPC ....... *G06Q 10/087* (2013.01); *G06Q 30/0283* (2013.01); *G06Q 30/06* (2013.01); *H02J 3/008* (2013.01); *H04Q 2209/60* (2013.01); *Y04S 10/56* (2013.01); *Y04S 20/30* (2013.01); *Y04S 20/32* (2013.01); *Y04S 20/40* (2013.01); *Y04S 50/10* (2013.01); *Y04S 50/14* (2013.01)

(58) Field of Classification Search
USPC .................................. 705/63, 412; 700/276
See application file for complete search history.

(56) References Cited

U.S. PATENT DOCUMENTS

| | | | | |
|---|---|---|---|---|
| 4,977,515 | A * | 12/1990 | Rudden et al. | 700/296 |
| 5,126,934 | A * | 6/1992 | MacFadyen | 700/11 |
| 5,289,362 | A * | 2/1994 | Liebl et al. | 700/22 |
| 5,301,122 | A * | 4/1994 | Halpern | 702/62 |
| 5,414,640 | A * | 5/1995 | Seem | 700/291 |
| 5,572,438 | A * | 11/1996 | Ehlers et al. | 700/295 |
| 5,598,349 | A * | 1/1997 | Elliason et al. | 700/295 |
| 5,675,503 | A * | 10/1997 | Moe et al. | 700/296 |
| 5,684,710 | A * | 11/1997 | Ehlers et al. | 700/293 |
| 5,696,695 | A * | 12/1997 | Ehlers et al. | 700/286 |
| 5,961,598 | A * | 10/1999 | Sime | 709/224 |
| 6,154,488 | A * | 11/2000 | Hunt | 375/219 |
| 6,199,124 | B1 * | 3/2001 | Ramakrishnan et al. | 710/40 |
| 6,253,193 | B1 * | 6/2001 | Ginter et al. | 705/57 |
| 6,311,105 | B1 * | 10/2001 | Budike, Jr. | 700/291 |
| 6,363,488 | B1 * | 3/2002 | Ginter et al. | 726/1 |
| 6,389,402 | B1 * | 5/2002 | Ginter et al. | 705/51 |
| 6,427,140 | B1 * | 7/2002 | Ginter et al. | 705/80 |
| 6,587,865 | B1 * | 7/2003 | Kimbrel et al. | 718/104 |
| 6,789,115 | B1 * | 9/2004 | Singer et al. | 709/224 |
| 6,956,500 | B1 * | 10/2005 | Ducharme et al. | 340/870.02 |
| 6,961,642 | B2 * | 11/2005 | Horst | 700/295 |
| 6,975,626 | B1 * | 12/2005 | Eberle et al. | 370/358 |
| 7,020,697 | B1 * | 3/2006 | Goodman et al. | 709/223 |
| 7,043,459 | B2 * | 5/2006 | Peevey | 705/412 |
| 7,061,929 | B1 * | 6/2006 | Eberle et al. | 370/423 |
| 7,065,580 | B1 * | 6/2006 | Eberle et al. | 709/232 |
| 7,130,719 | B2 * | 10/2006 | Ehlers et al. | 700/276 |
| 7,327,682 | B2 * | 2/2008 | Gandhi et al. | 370/235.1 |
| 7,401,294 | B2 * | 7/2008 | Chang et al. | 715/733 |
| 7,451,017 | B2 * | 11/2008 | McNally | 700/291 |
| 7,467,198 | B2 * | 12/2008 | Goodman et al. | 709/223 |
| 7,510,126 | B2 * | 3/2009 | Rossi et al. | 236/51 |
| 7,516,106 | B2 * | 4/2009 | Ehlers et al. | 705/412 |
| 7,537,172 | B2 * | 5/2009 | Rossi et al. | 236/51 |
| 7,571,120 | B2 * | 8/2009 | Fellenstein et al. | 705/26.3 |
| 7,590,589 | B2 * | 9/2009 | Hoffberg | 705/37 |
| 7,604,046 | B2 * | 10/2009 | Bergman et al. | 165/238 |
| 7,648,077 | B2 * | 1/2010 | Rossi et al. | 236/1 C |
| 7,707,125 | B2 * | 4/2010 | Haji-Valizadeh | 705/413 |
| 7,809,472 | B1 * | 10/2010 | Silva et al. | 700/277 |
| 7,908,161 | B2 * | 3/2011 | Benayon et al. | 705/7.11 |
| 8,060,396 | B1 * | 11/2011 | Bessler et al. | 705/7.23 |
| 2001/0010032 | A1 * | 7/2001 | Ehlers et al. | 702/62 |
| 2002/0019712 | A1 * | 2/2002 | Petite et al. | 702/61 |
| 2002/0062376 | A1 * | 5/2002 | Isoyama | 709/226 |
| 2002/0112076 | A1 * | 8/2002 | Rueda et al. | 709/245 |
| 2003/0067889 | A1 * | 4/2003 | Petite | 370/310 |
| 2003/0088784 | A1 * | 5/2003 | Ginter et al. | 713/189 |
| 2003/0120780 | A1 * | 6/2003 | Zhu et al. | 709/226 |
| 2004/0117330 | A1 * | 6/2004 | Ehlers et al. | 705/412 |
| 2004/0133314 | A1 * | 7/2004 | Ehlers et al. | 700/276 |
| 2004/0138786 | A1 * | 7/2004 | Blackett | G01D 4/00 700/295 |
| 2004/0208119 | A1 * | 10/2004 | Christodoulou et al. | 370/228 |
| 2004/0243737 | A1 * | 12/2004 | Beardsley et al. | 710/22 |
| 2005/0120102 | A1 * | 6/2005 | Gandhi et al. | 709/223 |
| 2006/0059253 | A1 * | 3/2006 | Goodman et al. | 709/223 |
| 2006/0106920 | A1 * | 5/2006 | Steeb et al. | 709/220 |
| 2006/0165005 | A1 * | 7/2006 | Frank et al. | 370/250 |
| 2006/0167784 | A1 * | 7/2006 | Hoffberg | 705/37 |
| 2006/0167984 | A1 * | 7/2006 | Fellenstein et al. | 709/203 |
| 2006/0181406 | A1 * | 8/2006 | Petite et al. | 340/521 |
| 2007/0013547 | A1 * | 1/2007 | Boaz | 340/870.02 |
| 2007/0087756 | A1 * | 4/2007 | Hoffberg | 455/450 |
| 2007/0094711 | A1 * | 4/2007 | Corley et al. | 726/3 |
| 2007/0243934 | A1 * | 10/2007 | Little et al. | 463/40 |
| 2007/0260723 | A1 * | 11/2007 | Cohen et al. | 709/223 |
| 2008/0319925 | A1 * | 12/2008 | Herold et al. | 705/400 |
| 2009/0185490 | A1 * | 7/2009 | Dotaro | 370/238 |
| 2009/0203322 | A1 * | 8/2009 | Horn et al. | 455/67.13 |
| 2009/0203372 | A1 * | 8/2009 | Horn et al. | 455/422.1 |
| 2010/0249955 | A1 * | 9/2010 | Sitton | F24F 11/0034 700/33 |

OTHER PUBLICATIONS

EP Search Report, dated Oct. 9, 2008.
"Crisp Report", [Online], (2006), 31 pages.
"Crisp Objectives", [Online], 2006, 2 pages.
"Distributed Energy and Demand Side Management", [Online], (2005), 4 pages.

* cited by examiner

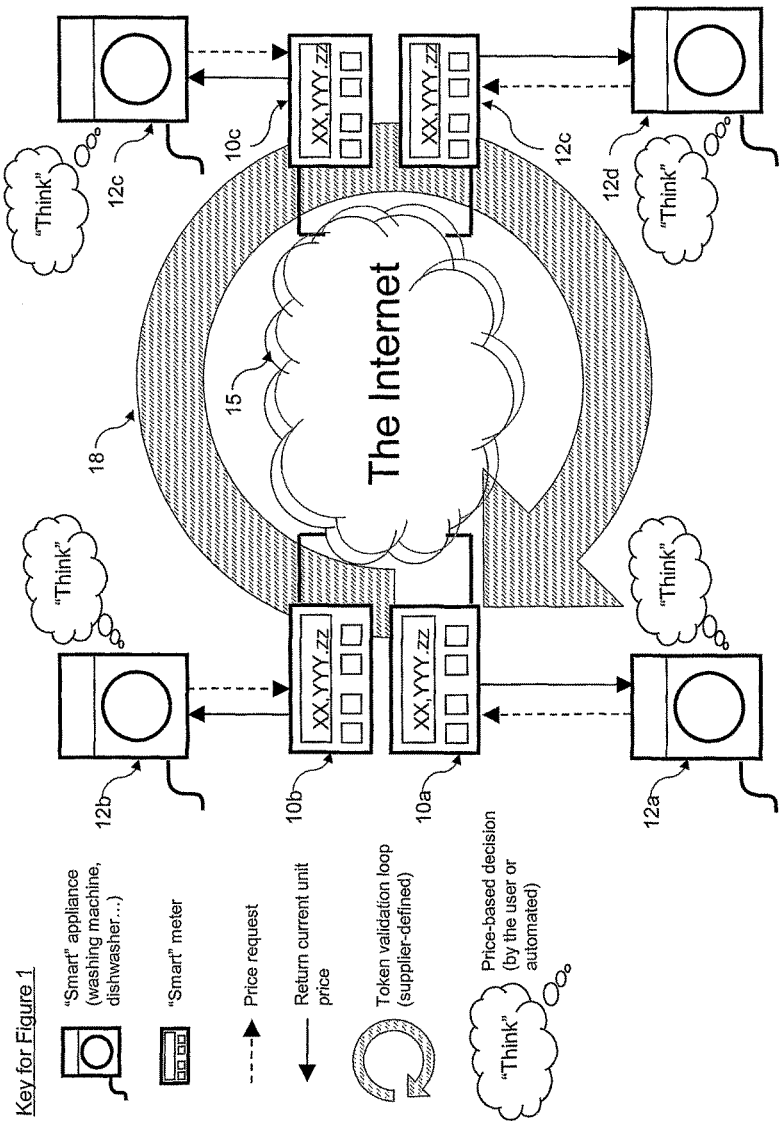
Figure 1 – Overall DDSM architecture

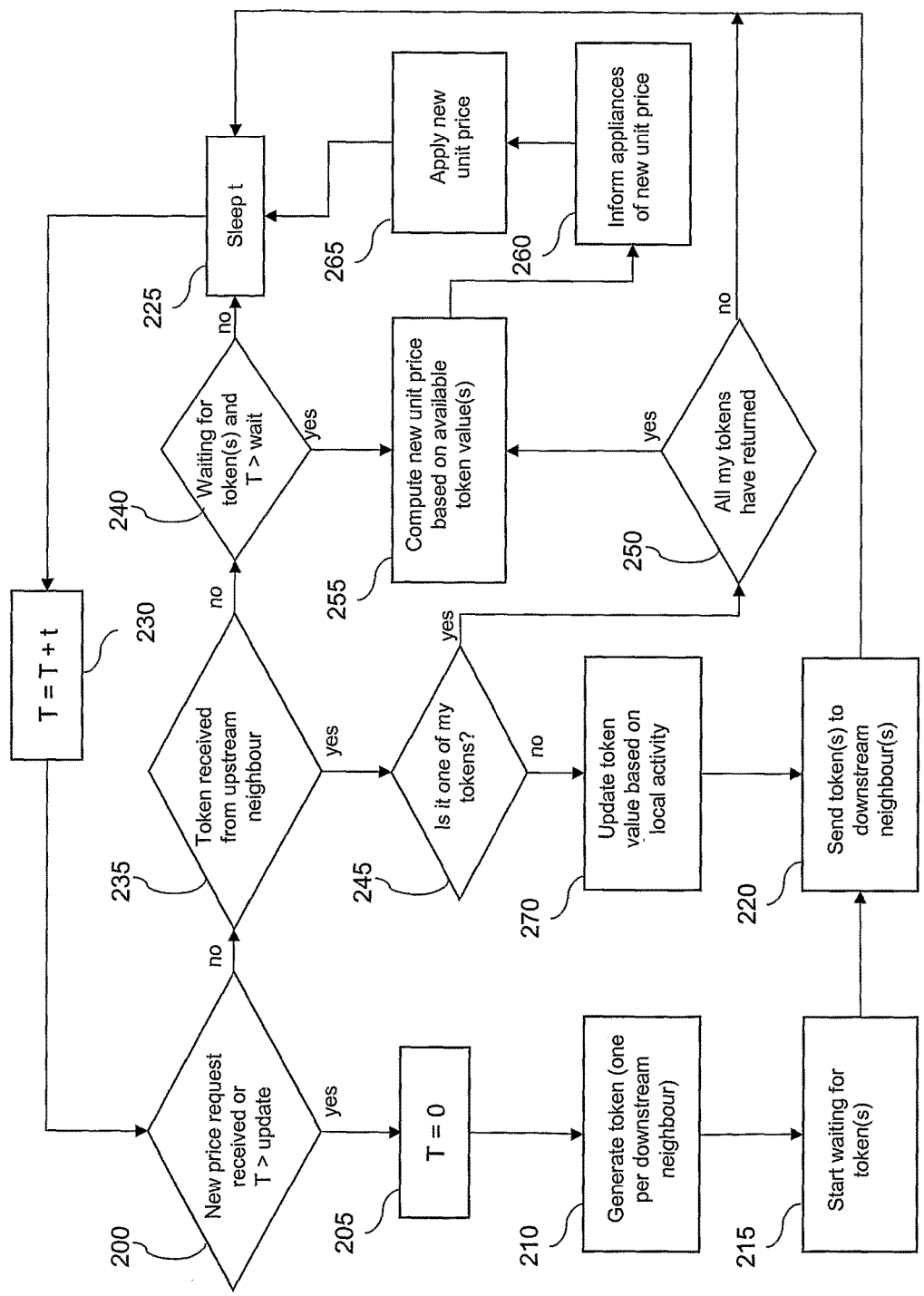
Figure 2 - "Smart" meter control and reasoning loop

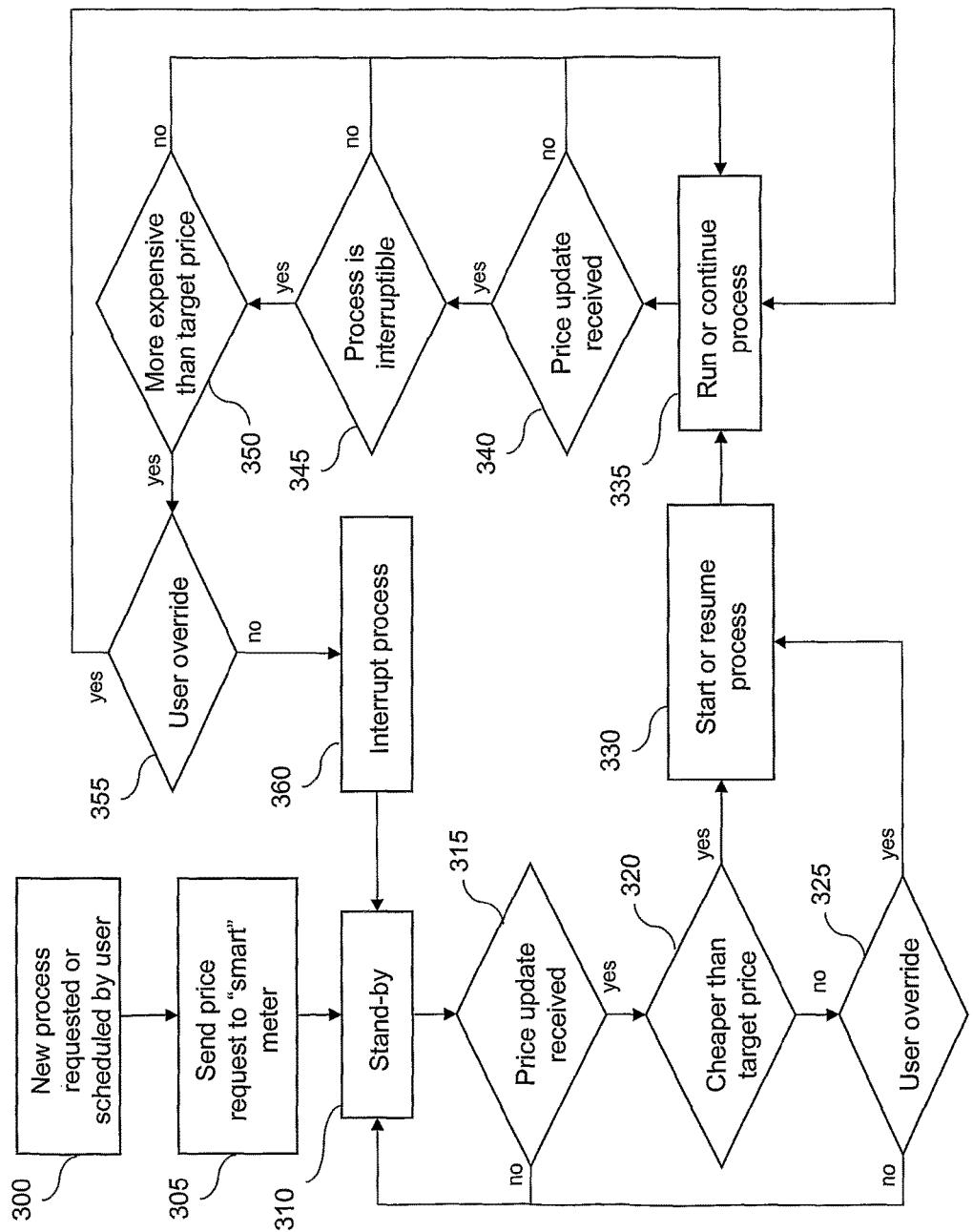
Figure 3 – "Smart" appliance control and reasoning loop

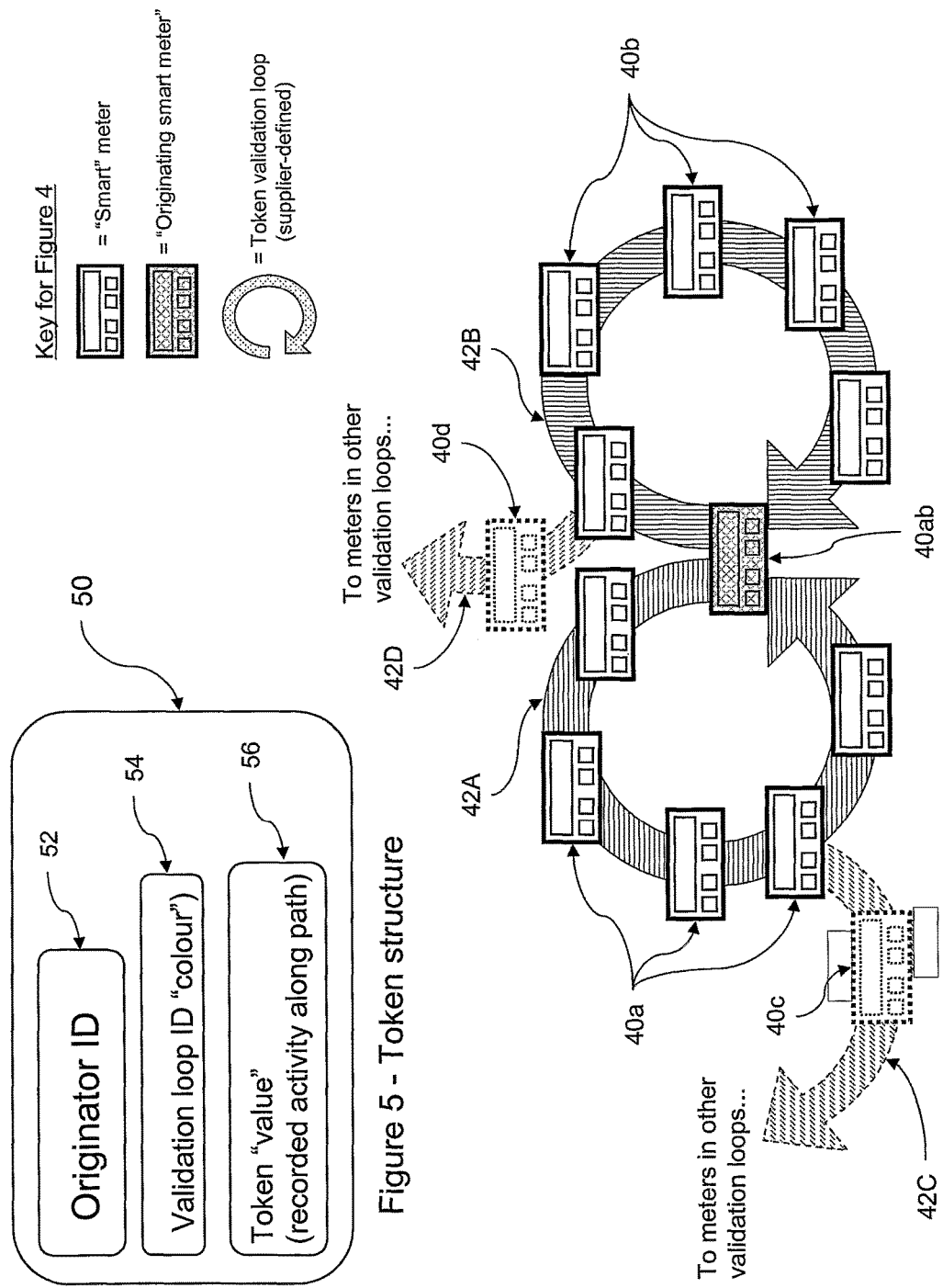
Figure 4 - Propagation Example
Figure 5 - Token structure

SCHEDULING USAGE OR PROVISION OF RESOURCES

This application is the U.S. national phase of International Application No. PCT/GB2009/000868 filed 31 Mar. 2009, which designated the U.S. and claims priority to EP Application No. 08251232.8 filed 31 Mar. 2008, the entire contents of each of which are hereby incorporated by reference.

TECHNICAL FIELD

The present invention relates to scheduling the usage or provision of resources. More specifically, aspects of the present invention relate to methods and apparatus for obtaining values indicative of resource-related activity in respect of a plurality of devices in such a way that the values so-obtained may be used in real-time or near real-time to influence the dynamic scheduling of the usage or provision of resources.

BACKGROUND TO THE INVENTION AND PRIOR ART

Demand-Side Management (DSM) relates to techniques that can be used by suppliers (typically of commodities) to influence demand patterns so as to gain an advantage (usually by controlling the frequency and/or amplitude of fluctuations). DSM is of particular interest to energy suppliers, which have long been using price incentives (the most common DSM technique) to "transfer" some of the flexible load to off-peak periods ("day-rate" v "night-rate") but may also be applicable in relation to other types of resources, including physical resources such as water, fuel, etc., and computing resources such as bandwidth, computing power, etc.

DSM is typically based on regular patterns (i.e. known recurrent fluctuations) and as such is not suitable for being used to control unexpected bursts in real-time. The primary reason for this is that although it is possible to communicate real-time price information to customers, there is as yet no user-friendly, efficient (automated or programmable) way for consumers to respond to that information. For this same reason, existing DSM techniques are ill-equipped to deal with situations in which micro-management, taking into account local specificities (e.g. micro-generation, local storage, use of community resources etc.) is desirable.

Prior art techniques for DSM generally do not permit real-time fluctuations to be taken into account in determining the demand, and to the extent that they attempt to take account of past usage data and/or predictions about future usage, they generally require information about variations in demand to be collated, reviewed and acted upon centrally, by a power generation or supply company, for example. Local factors such as micro-generation are therefore not easily taken account of in the pricing mechanism if at all.

SUMMARY OF THE INVENTION

According to a first aspect of the present invention, there is provided a method of obtaining a value indicative of resource-related activity in respect of a plurality of devices, said method using a network of metering means arranged to be in communication with one another, each of a plurality of said metering means being associated with at least one resource-consuming or resource-providing device and being arranged to obtain local resource-related activity data indicative of current levels of consumption or provision of said resource by said device or devices with which said metering means is associated, said method comprising:

a first one of said metering means initiating a circulation procedure by sending a token to a metering means downstream in said network of said first metering means, said token comprising an activity field for carrying a value indicative of resource-related activity data;

said circulation procedure continuing, until said token is received by said first metering means, by each downstream metering means in turn receiving said token, updating said activity field in dependence on its own locally-obtained resource-related activity data such that said activity field carries a value indicative of combined levels of consumption and provision of said resource by devices associated with each metering means by which said token has been received since initiation of the circulation procedure, and forwarding said token to a further downstream metering means;

in the event that said token is received by said first metering means, obtaining a value indicative of the combined level of resource-related activity in respect of devices associated with the metering means in said network in dependence on the value carried by the activity field.

Values so-obtained may be used in order to determine a current notional or real unit price for the resource in question, which may be taken into account by users or automated devices, for example, in scheduling activities involving the usage or provision of the resource in question.

Preferably said network of metering means comprises a bounded or "self-contained" network of metering means, such as a closed loop of metering means.

According to preferred embodiments, the first metering means is arranged to be in communication with metering means in a plurality of networks. This enables circulation procedures to be initiated by a particular metering means and performed concurrently via different networks, and ensures that a particular metering means is not prevented from performing a circulation procedure merely on account of one of its networks being out of action. Further, this enables determinations of unit prices to be made in dependence on values determined from circulation procedures in different networks, ensuring that uncharacteristically high or low values determined from any one network may be balanced through averaging over a few networks.

Where a metering means is arranged to be in communication with metering means in a plurality of networks, it is preferable for that metering means to be the only metering means in common between the respective networks.

A circulation procedure may be initiated in response to receipt of a request from a device with which said metering means is associated. Alternatively or additionally, it may be initiated at predetermined times, or after predetermined periods since the last circulation procedure, or in response to other triggers.

Determinations of unit prices for the resource may be done according to a predetermined function of the value carried by the activity field of one token, or of the values carried by the activity fields of a plurality of tokens in respect of which substantially concurrent circulation procedures have been performed. Where values carried by the activity fields of a plurality of tokens are available, the predetermined function may be dependent on a weighted average of values carried by the activity fields of a plurality of tokens in respect of which a circulation procedure has been performed. This may allow for determinations to take into account the possibility that some networks may have more metering means than others, and ensure that values determined via smaller networks do not carry undue weight, or it may be used to give greater weight to recently determined values, for example. The predetermined function may be of a form that ensures that the determined price will not rise above a predetermined maximum price, or fall below a predetermined minimum price. It may also include one or more parameters arranged to affect the shape and steepness of the "unit price against (average) token value" curve. The predetermined function may be of a form equivalent to or substantially equivalent to the following, for example:

$$UP=P_{min}+(1-e^{-\alpha V})(P_{max}-P_{min})$$

where UP=unit-price
  V=max($\bar{V}$, 0)
  $\bar{V}$=average "value" of collected tokens
  $P_{max}$=Highest Unit Price
  $P_{min}$=Lowest Unit Price
  α (alpha)=a positive parameter The resource concerned may be an energy resource such as electricity, gas, etc., a physical resource such as water, fuel, etc., or a computing resource such as bandwidth, computing power, etc. Embodiments of the method may be applicable to other types of resource.

According to a second aspect of the present invention, there is provided a method of scheduling an activity involving consumption or production of a resource by a device, the method comprising a request for a value indicative of resource-related activity in respect of a resource being provided to a metering means with which said device is associated, a method according to any of the methods of the first aspect being performed with said metering means with which said device is associated acting as the first metering means, whereby to determine a value indicative of resource-related activity in respect of a plurality of devices with which said metering means is associated, then scheduling said activity in dependence on a unit price for the resource determined in dependence on a predetermined function of said value and a predetermined target price for said resource in respect of said activity.

With methods according to this second aspect, such scheduling may comprises scheduling the start of a resource-consuming activity or scheduling the resumption of a previously interrupted resource-consuming activity in response to a determination that the current unit price is below a predetermined target price, or scheduling the interruption of a resource-consuming activity in response to a determination that the current unit price is above a predetermined target price. Alternatively or additionally, such scheduling may comprise scheduling the start of a resource-providing activity in response to a determination that the current unit price is above a predetermined target price, or scheduling the termination of a resource-providing activity in response to a determination that the current unit price is below a predetermined target price.

According to a third aspect of the present invention, there is provided an apparatus for obtaining a value indicative of resource-related activity in respect of a plurality of devices, said apparatus comprising a network of metering means arranged to be in communication with one another, each of a plurality of said metering means being associated with at least one resource-consuming or resource-providing device and being arranged to obtain local resource-related activity data indicative of current levels of consumption or provision of said resource by said device or devices with which said metering means is associated, each of said metering means comprising:
  circulation procedure initiating means arranged to initiate a circulation procedure by sending a token to a metering means downstream in said network, said token comprising an activity field for carrying a value indicative of resource-related activity data;
  circulation procedure continuing means arranged to receive tokens from a metering means upstream in said network, to update said activity field in dependence on its own locally-obtained resource-related activity data such that said activity field carries a value indicative of combined levels of consumption and provision of said resource by devices associated with each metering means by which said token has been received since initiation of the circulation procedure, and to forward said token to a downstream metering means;
  value obtaining means arranged to obtain a multiple-device value indicative of the combined level of resource-related activity in respect of devices associated with the metering means in said network in the event that a token is received whose circulation procedure was initiated by said metering means, said multiple-device value being determined in dependence on the value carried by the activity field.

According to a fourth aspect of the present invention, there is provided a first metering means for obtaining a value indicative of resource-related activity in respect of a plurality of devices, said first metering means being arranged to be in communication with other metering means in a network, each of said metering means being arranged to be associated with at least one resource-consuming or resource-providing device and to obtain local resource-related activity data indicative of current levels of consumption or provision of said resource by said device or devices with which said metering means is associated, said first metering means comprising:
  circulation procedure initiating means arranged to initiate a circulation procedure by sending a token to another metering means downstream in said network, said token comprising an activity field for carrying a value indicative of resource-related activity data;
  circulation procedure continuing means arranged to receive tokens from another metering means upstream in said network, to update said activity field in dependence on its own locally-obtained resource-related activity data such that said activity field carries a value indicative of combined levels of consumption and provision of said resource by devices associated with each metering means by which said token has been received since initiation of the circulation procedure, and to forward said token to a downstream metering means;
  value obtaining means arranged to obtain a multiple-device value indicative of the combined level of resource-related activity in respect of devices associated with the metering means in said network in the event that a token is received by said first metering means whose circulation procedure was initiated by said first metering means, said multiple-device value being determined in dependence on the value carried by the activity field.

It will be understood that options and variations listed above in relation to the first aspect are equally applicable in relation to the second, third and fourth aspects.

Preferred embodiments of the invention may be used to enable problems such as those outlined above to be addressed. They may be used to enable account to be taken of real-time fluctuations in demand, which may be achieved without requiring centralisation of real-time usage information. They may be used to enable local factors such as micro-generation to be taken account of in a pricing mechanism, and may be used to allow consumers to decide on or program their own usage in such a way as to respond to this pricing mechanism in a way they find suitable (i.e. responding to a trade-off between flexibility and price). This may be achieved by connecting "smart meters", via the Internet for example, which may in effect allow resource consumers (and providers, in situations where micro-generation is being performed, for example) to indirectly influence each other's activity patterns.

There has been a significant amount of work on Demand-Side-Management, but as far as the present inventors are aware, none of it describes a practical distributed solution such as that to which preferred embodiments of the invention relate, based on explicit peer-to-peer (P2P) style communication between networked "smart" meters. Some of the prior art does look at the opportunity of combining DSM with distributed power generation, but the demand-side management aspect doesn't call upon decentralised management techniques (e.g. www.det.csiro.au/science/de s/de dsm.htm). Decentralised management is desirable because it would allow for simple and robust implementation in large networked systems, and would allow implementation flexibility at the level of communities, single buildings or even individual customers. As for the idea of leveraging Information and Communication Technologies (ICT) solutions for energy management, the CRISP project (see www.ecn.nl/crisp/) makes reference to distributed, bottom-up approaches, but its focus appears to be on dealing intelligently with fluctuations in the demand and availability of alternative sources (see www.ecn.nl/crisp/crisp-brochure-print.pdf), rather than on use of novel DSM techniques.

BRIEF DESCRIPTION OF THE DRAWINGS

A preferred embodiment of the present invention will now be described with reference to the appended drawings, in which:

FIG. 1 shows a network of "smart meters" and associated "smart appliances" for which a method according to a preferred embodiment of the invention would be applicable;

FIG. 2 is a flow-chart illustrating how a method according to preferred embodiment of the invention could be implemented in a network of "smart meters";

FIG. 3 is a flow-chart illustrating a possible control and reasoning loop that could be used by a "smart appliance" operating in conjunction with a network of smart meters;

FIG. 4 illustrates how a smart meter may be a member of more than one network of smart meters; and FIG. 5 illustrates the data that may be carried by a token during a circulation procedure.

DESCRIPTION OF PREFERRED
EMBODIMENTS OF THE INVENTION

With reference to FIGS. 1 to 5, a method of obtaining a value indicative of resource-related activity in respect of a plurality of devices according to a preferred embodiment will be described. An explanation will also be given of how a value so-obtained may be used in determining a current notional or real unit price for the resource in question, which may be taken into account by users or automated devices, for example, in scheduling activities involving the consumption/usage or generation/provision of the resource in question.

Overview

In the following, a framework which may be referred to as a Distributed Demand Side Management (DDSM) framework will be described. Such a framework may be used to allow consumers to sign up for a scheme such that they may effectively affect and adjust each other's consumption profile of a resource in order to shave demand peaks. This may be beneficial to resource generation and distribution entities such as electricity companies because spreading peaks in demand can lead to lower overall generation costs (generation equipment will not need to be capable of withstanding such high peaks in demand) and can also reduce power losses in transmission. In return for participating in such schemes, suppliers may be able to offer their customers incentives such as a chance to pay a lower average price for the resource by a resource supply or distribution company. Such a framework may be applicable at various levels, such as where the consumers are communities, buildings within a community, or appliances within a building. Because the framework is distributed, it can be used to remove the need for centralised accounting and/or enforcement of a restriction policy.

The logic essentially may involve cross-connecting individual "consumer units" who have opted into the scheme according to a topology which would generally (but not necessarily) be defined under the control of the resource provider.

Each time such a consumer unit intends to initiate a resource-consuming process (or possibly a resource generation process, although different considerations may apply for this), it circulates one or more "tokens", which are then used to collect information about collective consumption and calculate a unit-price accordingly. The process may then be started only if the price is lower than a specified target, otherwise it may be put "on hold" until this condition is met (unless the user chooses to override the decision and pay a higher price). In practice, the "consumer unit" would in general be an intelligent controller (e.g. a "smart meter"), connected to a communication network such as the Internet in order to allow it to circulate tokens, rather than its human owner. This would allow for the customer to benefit from the framework without having to understand the complexity of the token circulation mechanism: concretely, the contract might only stipulate that unit price may vary between a minimum and a maximum rate (depending on the overall load and supply) and that users may specify a target price that they are willing to pay for flexible processes (which can then be scheduled automatically on their behalf). Such a scheme could be promoted through some incentives such as a reduction in the minimum rate, or the contractual guarantee of a lower average price. Note that in the context of the distributed framework described here, local price updates and process scheduling may be automatic and fully decentralised: while it may be necessary or appropriate for the resource provider (or an agent acting for the resource provider) to be involved during a topology definition phase (described below), the scheme need not involve any further direct, ongoing input from the resource provider.

It should be noted that business and contractual considerations such as those outlined above need not be of any relevance to embodiments of the invention, which instead may simply concern the technical method and technical means by virtue of which a unit price for a resource may be determined.

Creation of the Overlay (Token Validation Loops)

Preferably, the networks by virtue of which the meters are connected take the form of simple closed loops, as such a topology is a simple way of ensuring that a token can easily be circulated via all of the meters in the loop and return to its originating meter. Other topologies are possible, however.

In the present exemplary implementation, the characteristics of the overlay may be defined by two parameters: the number of loops that every meter should be part of (which may be referred to as "dimensionality") and the target length of these loops (number of meters per loop). Preferably, every meter is only connected to its predecessor and to its follower in each loop of which it is a member, and can only send tokens to its follower(s) and receive tokens from its predecessor(s), i.e. the propagation is always from the "upstream" neighbour to the "downstream" neighbour. For robustness purposes, dimensionality should preferably be greater than one, so that if one validation loop is "broken" (which may happen if any meter in that loop fails or is otherwise dysfunctional), one or more other tokens may still be able to complete their own round-trip via their own loops. For the same reason, it is preferable for there not to be more than one point of contact between any two loops (i.e. if loop 1 contains meters A and B and loop 2 contains meter A, then loop 2 may not contain meter B). Indeed, this would ensure that the only meter whose failure could disrupt the propagation of two tokens from the same origin is the originator itself. Any other disruption would effectively require the failure of at least two distinct meters. A possible algorithm for growing an overlay that obeys all these conditions (no loop longer than the target length, no more than one intersection between loops) for arbitrary parameter values (dimensionality and target length) and for any number of meters is given in the Appendix.

With reference to FIG. 1, a single-loop network of "smart meters" 10*a*, 10*b*, 10*c*, 10*d* and their associated "smart appliances" 12*a*, 12*b*, 12*c*, 12*d* is shown. In this example, one appliance 10 is shown associated with each meter 10, but there may be more than one appliance associated with each meter. The appliances may include resource providers such as micro-generators, as well as resource consumers such as washing machines, dishwashers etc., and there may be a combination of resource providers and resource consumers associated with any one meter. What is generally of relevance from the point of view of the meter is the net consumption (or production) of the resource in question.

The meters 10 are in communication with each other via a network such as the Internet 15. While each meter may therefore have an IP address and be capable of communicating with any other meter having an IP address, the communication between meters may be arranged such that meter 10*a* is capable of sending data in the form of a token to meter 10*b*, which is capable of sending the token to meter 10*c*, which is capable of sending the token to meter 10*d*, which is capable of sending the token back to meter 10*a*. Thus, from the point of view of a token originating at meter 10*a*, the meters are connected by a simple one-way closed loop 18 that passes each meter in turn before returning to originating meter 10*a*. This may be achieved by use of the mechanism of IP tunneling, for example.

Token Circulation: Updating Token Value and Using Token Value to Compute Unit-Price An exemplary procedure for updating a token value will now be explained with reference to FIG. 2. Essentially, the procedure involves every meter in the loop incrementing the current value with its own locally measured activity, i.e. the current (net) energy consumption of the household. Note that this is how DDSM would be able to take into account micro-generation: the net consumption could be reduced or even drop to negative values if local energy production facilities like rooftop solar panels, wind turbines etc. are generating power.

A token circulation procedure may be initiated at step 200 on account of meter 10*a* receiving a price request from appliance 12*a*, for example. (How this price request may be triggered will be discussed later with reference to FIG. 3). If such a request is received ("yes" branch), meter 10*a* sets a time T at zero (step 205), then generates a token ready to be sent to meter 10*b*. (If meter 10*a* is a member of other loops, it generates a token ready to be sent to its downstream neighbour in each loop—more on this will be explained later with reference to FIG. 4). Meter 10*a* then adopts a "waiting for tokens" mode (step 215) and sends a token to meter 10*b* and to its downstream neighbours in any other loops (step 220). It may then enter a sleep mode (step 225) for a period of time t, at the expiry of which (step 230) the procedure returns to step 200. The procedure continues with the meter 10*a* checking (at step 235) if it has received any tokens from an upstream neighbour such as meter 10*d*.

If meter 10*a* has received a token from an upstream neighbour at step 235, it checks at step 245 to see if it is one of its own tokens (i.e. a token for which it is the originating meter). If so, it may check at step 250 whether or not all of its tokens have returned. If it finds that it is still waiting for one or more of its own tokens, it may pass via the "sleep" mode (step 225) before returning to step 200. If it finds (at step 250) that it all of its tokens have returned, it may proceed to step 255 (see below).

If meter 10*a* finds at step 235 that it has not received any more tokens from an upstream neighbour, it may continue to wait (step 240), passing via the sleep mode (step 225) before returning to step 200. If at step 240 it is determined that a maximum acceptable "wait" period has now passed (without all of its tokens having returned), meter 10*b* may proceed to step 255

If the procedure reaches step 255 by either of the above routes, the meter proceeds to compute a new unit price based on values carried by any of its own tokens which have returned. A possible manner in which this computation may be done will be outlined later.

Meter 10*a* may then inform any of its associated appliances, which may currently be in "stand-by" mode (such as the appliance 12*a* which triggered the price request in the first place), or may already be running an activity, of the current or new unit price (step 260), and apply this price to any resulting resource consumption (step 265) before returning via steps 225 and 230 to step 200.

In addition to performing their function of determining prices on behalf of their own appliances, the meters 10 are also arranged to assist other meters in the same loop or network in carrying out their corresponding procedures. This is reflected by step 270, which is reached if a meter finds at step 245 that a token it has received is not one of its own tokens (i.e. it is a token for which another meter is the originating meter). In this case, it updates the token value being carried by this token in dependence on the total (or net) "local" activity levels of the appliances with which it associated, before forwarding the token to its downstream neighbour in the appropriate loop (step 220).

An additional point should be noted about the token circulation procedure. As well as being triggered by receipt of a new price request from an associated appliance, the whole procedure may alternatively be triggered purely at predetermined times, or because a period of time has elapsed since the last time a particular meter obtained a new unit price. This may enable an associated appliance to stop or suspend an existing resource-consuming activity (such as an ongoing wash-cycle of a washing-machine) if it is found that the actual unit price has risen to such an extent that it is now above an acceptable level. This is reflected by the option in step 200 of initiating the token circulation procedure if time T has been incremented sufficiently (at step 230) that it is above an "update" time.

Another point should also be noted. The first meter may include its "update" (i.e. its contribution to the token value based on its own locally-obtained activity data) at the start or the end of circulation, or it may take account of it in a different manner, for example by taking account of it in a later calculation rather than including it in the token value. In some situations such as this, it may even be applicable not to include it at all in the determination.

As a result of the above token circulation procedure, when a token comes back to its initiating meter, the value carried by it is representative of the total (or net) consumption within the corresponding loop 18. This will be referred to as a validation loop. A current unit price for the resource may be determined from this value in any of a variety of ways, based on the value carried by one returned token, or, where the meter is a member of more than one validation loop and more than one token has returned, based on an average of the values carried by those tokens. A candidate function for translating a (set of) token value(s) into a new unit-price is given by the following:

$$UP = P_{min} + (1 - e^{-\alpha V})(P_{max} - P_{min})$$

where UP=Unit Price
V=max($\bar{V}$, 0)
$\bar{V}$=average "value" of collected tokens
$P_{max}$=Highest Unit Price
$P_{min}$=Lowest Unit Price
α (alpha)=a positive parameter A function in this form can be used to ensure that the unit price never rises above a predetermined maximum, $P_{max}$, even if the current total (net) consumption is found to be very high, but also never drops below a predetermined minimum, $P_{min}$, even if current total (net) consumption is found to be very low or zero.

The value of the alpha parameter should preferably be set so as to be representative of length of a loop (generally, all other things equal, the longer the loop, the higher the token value) and so as to generate the unit-price distribution desired by the supplier (the higher alpha, the faster the price increases with the combined demand). Other (e.g. non-linear) functions could be used: the precise formula above is provided as an example for illustration purposes. It should be noted that this candidate function may be suitable if all loops have reached a common "target" length (i.e. number of meters). Where this is not the case (e.g. while the overlay is growing and new meters are being added (e.g. using the algorithm in the appendix) different loops may have different numbers of meters. It may then be appropriate to use a weighted average function instead. This could be achieved by arranging for tokens to contain a "counter" field (incremented at each hop) allowing the originator to determine how many meters are currently in the loop and/or have contributed to the token value.

"Smart Appliance" Control and Reasoning Loop

Now that the possible functionality of the smart meters has been explained, the interaction between them and the "smart appliances" with which they are associated will be explained with reference to FIG. 3, which illustrates the possible functionality of the smart appliances. The flowchart shown in FIG. 3 relates in general to the situation where the appliance concerned is (predominantly) a resource-consuming appliance, but it will be understood that for a (predominantly) resource-providing appliance such as a micro-generator, similar but slightly different reasoning would instead be applicable.

Starting at step 300, if a user requests or has scheduled a new resource-consuming process to be performed by an appliance 12, the appliance sends a price request to the smart meter 10 with which it is associated (step 305). The appliance then adopts a standby mode (step 310) until such time as a price update is received from the appropriate meter (step 315). During the standby period between steps 310 and 315, a token circulation and price determination procedure such as that explained with reference to FIG. 2 may be performed by the appropriate meter.

Once a price update has been received, the appliance determines at step 320 if it is cheaper than a set target price for the activity in question. If not, the procedure may return to the standby mode (step 310) until such time as another price update is received. The user may however be given an opportunity (at step 325) to override the decision that the current price is too high for the activity in question.

If the user overrides such a decision or if the price update received indicates that the current price is cheaper than the set target price, the appliance's activity may then be started (step 330), or, if it had previously been started but suspended, it may be resumed. It may then be run/continued (step 335).

If during the running of an activity a further price update is received (at step 340), and it is determined that the activity is interruptible (step 345), the price update is used to check if the current price has become higher than the target price for the activity (step 350). If so, and subject again to user override (step 355), the activity may be interrupted (step 360). The procedure then returns to the standby mode (step 310) until such time as another price update (determined by the appropriate meter using the process shown in FIG. 2, for example) is received (step 315).

Referring briefly again to the situation where the appliance concerned is (predominantly) a resource-providing appliance such as a micro-generator, it will be understood that steps 320 and 350 may instead involve a decision to start or resume a resource-providing activity such as electricity generating if it is determined that the current price is above a predetermined target price, rather than below a predetermined target price.

Potential Membership of Multiple Loops

With reference to FIG. 4, it will be noted that a smart meter may, and preferably should, be a member of more than one network of smart meters. This will be explained by way of example from the point of view of one particular meter 40*ab* when acting as the token initiating meter, but the same considerations may generally apply to each meter shown. Meter 40*ab* is shown to be a part of two individual "single-loop" networks 42A and 42B. Network 42A therefore contains meters 40*a* as well as meter 40*ab*, all in communication, and to which a token initiated by meter 40*ab* would be circulated; likewise network 42B therefore contains meters 40*b* as well as meter 40*ab*, to which another token initiated by meter 40*ab* would be circulated. Two further networks 42C and 42D are indicated, respectively having meters 40*c* and 40*d* therein, but as meter 40*ab* is not in either of networks 42C and 42D, token initiated by meter 40*ab* would not be circulated via networks 42C and 42D.

Possible Information Carried by Tokens

Tokens may be in the form of one or more IP packets, enabling them to be circulated via the Internet, possibly using IP tunneling. It will be understood that other forms of token may be applicable in some circumstances. FIG. 5 illustrates types of data that may be carried by tokens during a circulation procedure.

Token 50 has a field 52 carrying the "Originator ID". During a token circulation procedure, this allows an originating meter to recognise one of its own tokens on its return after circulation and make use of the token value it is carrying. It also enables other meters in the network to recognise that tokens they receive that originated in other meters are not their own, in which case they may simply update the token value carried therein and forward the token to the next meter in the network.

Token 50 also has a field 54 carrying "Validation Loop ID", referred to as "colour", but shown as different types of cross-hatching in FIG. 4. This enables meters to forward tokens to a downstream meter in the appropriate network, thereby avoiding a token originating from meter 40*ab* in Figure from being forwarded incorrectly into one of networks 42C and 42D.

Further, token 50 has a field 56 carrying the token value, as updated along the path by meters it has passed in the light of the local activity of the appliances with which those meters are associated.

It will be understood that the arrangement of information carried by the tokens need not be as indicated in the preceding paragraphs, provided appropriate information is conveyed to the relevant meters. The information may be arranged or carried in different ways, and may include other information such as a "counter" field as referred to earlier (incremented at each hop) allowing the originator to determine how many meters are currently in the loop and/or have contributed to the token value.

Additional Remarks

It should be clear that DDSM according to preferred embodiments would normally only be applicable to the "flexible" part of the demand, i.e. energy-consuming processes that can be delayed without major inconvenience to the user (typical examples of domestic appliances running such processes are washing-machines, tumble-dryers, dish-washers etc.). With some additional restriction on the maximum acceptable delay, such schemes could of course be applied to semi-flexible processes such as air-conditioning, heating, water heating or refrigeration (e.g. a cooling cycle can often be delayed by several minutes without incurring any damaging increase in fridge temperature). Other processes (e.g. switching on lights or televisions) are, however, less likely to be amenable to the approach. In a situation where at least part of the demand is inflexible, it may be appropriate for the corresponding processes to be billed separately (the overall consumption could still be used for the purpose of updating token values). On a conceptual level, this could be achieved simply by charging all processes characterised as "inflexible" at a fixed (or time-of-day-based) rate and all others at a variable (DDSM-based) rate. In practice, this may require the corresponding appliances to be connected to separate meters.

APPENDIX

Possible Algorithm for Growing an Overlay public void connect (Unit newComer, int nDimensions, int ringSize)

```
{
  Network allRingsCopy=(Network) allRings.clone();
                                              Creates a copy of all existing loops
    allRingsCopy.trim(ringSize);
                              Removes all loops that have already reached the target length
    Ring[] homes=new Ring[nDimensions];
    int i=0;
    while(i<nDimensions)
    {
      if(allRingsCopy.size()>0)
                                                      If some existing loops are not "full"...
      {
          homes[i]=(Ring) allRingsCopy.get(0);
          homes[i].insert(newComer);
                                                              Adds newcomer to existing loop
          allRings.insert(homes[i]);
                                                      Replaces existing loop with updated loop
          for(int j=0;j<homes[i].size();j++)
          {
            Unit thisUnit=(Unit) homes[i].get(j);
            int k=0;
            while(k<allRingsCopy.size())
            {
               Ring thisRing=(Ring) allRingsCopy.get(k);
               if(thisRing.contains(thisUnit))
               {
                  allRingsCopy.remove(thisRing);
              Removes any loop that has an intersection with iᵗʰ loop from candidate (i.e. not "full") existing loops
            }
            else
            {
```

```
            k++;
        }
      }
    }
  }
}
else
{
    homes[i]=new Ring(allRings.size(),newComer);
                                    Creates new loop with newcomer as seed unit
    allRings.insert(homes[i]);
                                    Adds new loop to existing list
  }
  i++
 }
}
```

The invention claimed is:

1. A method of obtaining and using a value indicative of resource-related activity in respect of a plurality of devices, said method using a network of meters arranged to be in communication with one another, each of a plurality of said meters being associated with at least one resource-consuming or resource-providing device and being arranged to obtain local resource-related activity data indicative of current levels of consumption or provision of said resource by said device or devices with which said meter is associated, said network of meters comprising a closed loop of at least three meters, said method comprising:

a first one of said meters initiating a circulation procedure by sending a token in a downstream direction to a meter downstream in said network of said first meter, said token comprising an activity field for carrying a value indicative of resource-related activity data;

said circulation procedure continuing, until said token is received by said first meter, by each downstream meter in turn performing, by a processor, steps of:

(i) receiving said token;

(ii) updating said activity field by summing the value indicative of resource-related activity data on receipt of the token by said meter with a value indicative of the resource-related activity data locally-obtained by said meter such that said activity field carries a value indicative of combined levels of consumption and provision of said resource by devices associated with each meter by which said token has been received since initiation of the circulation procedure to thereby be indicative of a combined level of resource-related activity; and (iii) forwarding said token in said downstream direction to a further downstream meter of the at least three meters in the closed loop;

when said token is received by said first meter having been received and forwarded in said downstream direction by the other meters in the closed loop of meters, obtaining a value indicative of the combined level of resource-related activity in respect of devices associated with the meters in said network in dependence on the value carried by the activity field; and controlling the activity in respect of the plurality of devices based on the obtained value.

2. A method according to claim 1 wherein said first meter is arranged to be in communication with one or more meters in each of a plurality of networks.

3. A method according to claim 2 wherein said first meter is the only meter in communication with the one or more meters in each of the plurality of networks.

4. A method according to claim 1 wherein said step of initiating a circulation procedure is performed in response to receipt of a request from a device with which said meter is associated.

5. A method according to claim 1 wherein said resource comprises an energy resource.

6. A method according to claim 1 wherein said resource comprises a physical resource.

7. A method according to claim 1 wherein said resource comprises a computing resource.

8. A method of scheduling an activity involving consumption or production of a resource by a device, said method using a network of meters arranged to be in communication with one another, each of a plurality of said meters being associated with at least one resource-consuming or resource-providing device and being arranged to obtain local resource-related activity data indicative of current levels of consumption or provision of said resource by said device or devices with which said meter is associated, said network of meters comprising a closed loop of at least three meters, said method comprising:

receiving from one of said devices a request for a value indicative of resource-related activity in respect of a resource, the request being received by an initiating meter with which said requesting device is associated;

said initiating meter then initiating a circulation procedure by sending a token in a downstream direction to a meter downstream in said network, said token comprising an activity field for carrying the value indicative of resource-related activity data;

said circulation procedure continuing, until said token is received by said initiating meter, by each downstream meter in the network in turn performing, by a processor, steps of:

(i) receiving said token;

(ii) updating said activity field by summing the value indicative of resource-related activity data on receipt of the token by said meter with a value indicative of the resource-related activity data locally-obtained by said meter such that said activity field carries a value indicative of combined levels of consumption and provision of said resource by devices associated with each meter by which said token has been received since initiation of the circulation procedure to thereby be indicative of a combined level of resource-related activity; and (iii) forwarding said token in said downstream direction to a further downstream meter of the at least three meters in the closed loop;

when said token is received by said initiating meter having been received and forwarded in said downstream direction by the other meters in the closed loop of meters, obtaining the value indicative of the combined level of resource-related activity;

scheduling said activity in dependence on a unit price for the resource determined in dependence on a predetermined function of said obtained value and a predetermined target price for said resource in respect of said activity; and controlling the activity by the device based on the scheduling.

9. A method of scheduling an activity according to claim 8 wherein said scheduling comprises scheduling the start of a resource-consuming activity or scheduling the resumption of a previously interrupted resource-consuming activity in response to a determination that a current unit price is below a predetermined target price, or scheduling the interruption of a resource-consuming activity in response to a determination that a current unit price is above a predetermined target price.

10. A method of scheduling an activity according to claim 8 wherein said scheduling comprises scheduling the start of a resource-providing activity in response to a determination that a current unit price is above a predetermined target price, or scheduling the termination of a resource-providing activity in response to a determination that a current unit price is below a predetermined target price.

11. An apparatus for obtaining a value indicative of resource-related activity in respect of a plurality of devices, said apparatus comprising a network of meters arranged to be in communication with one another, each of a plurality of said meters being associated with at least one resource-consuming or resource-providing device and being arranged to obtain local resource-related activity data indicative of current levels of consumption or provision of said resource by said device or devices with which said meter is associated, said network of meters comprising a closed loop of at least three meters, each of said meters comprising:
 a processing system, including a processor, the processor being configured to at least perform:
  initiating a circulation procedure by sending a token in a downstream direction to a meter downstream in said network, said token comprising an activity field for carrying a value indicative of resource-related activity data;
  receiving tokens from a meter upstream in said network, update said activity field by summing the value indicative of resource-related activity data on receipt of the token by said meter with a value indicative of the resource-related activity data locally-obtained by said meter such that said activity field carries a value indicative of combined levels of consumption and provision of said resource by devices associated with each meter by which said token has been received since initiation of the circulation procedure to thereby be indicative of a combined level of resource-related activity, and forward said token in said downstream direction to a downstream meter of the at least three meters in the closed loop;
  obtaining a multiple-device value indicative of the combined level of resource-related activity in respect of devices associated with the meters in said network when the token is received whose circulation procedure was initiated by said meter and has been received and forwarded in said downstream direction by the other meters in the closed loop of meters, said multiple-device value being determined in dependence on the value carried by the activity field; and
  controlling the activity in respect of the plurality of devices based on the obtained multiple-device value.

12. A first meter for obtaining a value indicative of resource-related activity in respect of a plurality of devices, said first meter being arranged to be in communication with other meters in a network, each of said meters being arranged to be associated with at least one resource-consuming or resource-providing device and to obtain local resource-related activity data indicative of current levels of consumption or provision of said resource by said device or devices with which said meter is associated, said network of meters comprising a closed loop of at least three meters, said first meter comprising:
 a processing system, including a processor, the processor being at least configured to:
  initiate a circulation procedure by sending a token in a downstream direction to another meter downstream in said network, said token comprising an activity field for carrying a value indicative of resource-related activity data;
  receive tokens from another meter upstream in said network, update said activity field by summing the value indicative of resource-related activity data on receipt of the token by said meter with a value indicative of the resource-related activity data locally-obtained by said meter such that said activity field carries a value indicative of combined levels of consumption and provision of said resource by devices associated with each meter by which said token has been received since initiation of the circulation procedure to thereby be indicative of a combined level of resource-related activity, and forward said token in said downstream direction to a downstream meter of the at least three meters in the closed loop;
  obtain a multiple-device value indicative of the combined level of resource-related activity in respect of devices associated with the meters in said network when the token is received by said first meter whose circulation procedure was initiated by said first meter and has been received and forwarded in said downstream direction by the other meters in the closed loop of meters, said multiple-device value being determined in dependence on the value carried by the activity field; and
  control the activity in respect of the plurality of devices based on the obtained multiple-device value.

* * * * *